(12) United States Patent
Ishikawa

(10) Patent No.: US 8,936,829 B2
(45) Date of Patent: Jan. 20, 2015

(54) METHOD OF AFTERTREATMENT OF AMORPHOUS HYDROCARBON FILM AND METHOD FOR MANUFACTURING ELECTRONIC DEVICE BY USING THE AFTERTREATMENT METHOD

(75) Inventor: Hiraku Ishikawa, Sendai (JP)

(73) Assignee: Tokyo Electron Limited (JP)

( * ) Notice: Subject to any disclaimer, the term of this patent is extended or adjusted under 35 U.S.C. 154(b) by 443 days.

(21) Appl. No.: 12/864,606

(22) PCT Filed: Jan. 19, 2009

(86) PCT No.: PCT/JP2009/050634

§ 371 (c)(1),
(2), (4) Date: Jul. 26, 2010

(87) PCT Pub. No.: WO2009/096251

PCT Pub. Date: Aug. 6, 2009

(65) Prior Publication Data

US 2010/0304014 A1    Dec. 2, 2010

(30) Foreign Application Priority Data

Jan. 30, 2008   (JP) ................................. 2008-018858

(51) Int. Cl.
*C23C 16/56*  (2006.01)
*H01L 21/314*  (2006.01)
(Continued)

(52) U.S. Cl.
CPC ............ *H01L 21/3146* (2013.01); *C23C 16/26* (2013.01); *C23C 16/56* (2013.01); *H01L 21/67109* (2013.01); *H01L 21/6719* (2013.01); *H01L 21/67207* (2013.01);
(Continued)

(58) Field of Classification Search
USPC ............................................. 427/58; 118/724
See application file for complete search history.

(56) References Cited

U.S. PATENT DOCUMENTS 6,197,704 B1   3/2001   Endo et al.
6,573,030 B1   6/2003   Fairbairn et al.
(Continued)

FOREIGN PATENT DOCUMENTS

JP    11-297686       10/1999
JP    2002-012972  *  1/2002   .............. C23C 16/26
(Continued)

OTHER PUBLICATIONS

Korean Office Action—Korean Application No. 10-2010-7016154 issued on Jul. 19, 2011, citing JP 11-297686.
(Continued)

*Primary Examiner* — Michael Cleveland
*Assistant Examiner* — Lisha Jiang
(74) *Attorney, Agent, or Firm* — Cantor Colburn LLP

(57) ABSTRACT

Functional groups on the outermost surface of an amorphous hydrocarbon film are substituted. The amorphous hydrocarbon film is formed on a silicon substrate Sub, which is coated with a low-k film. A heat treatment is performed on the amorphous hydrocarbon film in a non-silane gas atmosphere. Next, a heat treatment is performed on the amorphous hydrocarbon film in a silane gas atmosphere immediately after the heat treatment in a non-silane gas atmosphere. After the heat treatment, a film, such as a hard mask, is formed.

10 Claims, 12 Drawing Sheets

(51) Int. Cl.
  *C23C 16/26* (2006.01)
  *H01L 21/67* (2006.01)
  *H01L 21/768* (2006.01)

(52) U.S. Cl.
  CPC ... *H01L 21/76807* (2013.01); *H01L 21/76826* (2013.01); *H01L 21/76828* (2013.01); *H01L 21/76835* (2013.01); *H01L 2221/1036* (2013.01)
  USPC .......... 427/126.1; 427/58; 427/331; 427/377; 427/255.26; 427/255.27

(56) References Cited

U.S. PATENT DOCUMENTS 8,377,818 B2 * 2/2013 Ishikawa ................ 438/622
2005/0130404 A1 6/2005 Moghadam et al.
2008/0194855 A1 * 8/2008 Gottschalk-Gaudig et al. ...................... 556/407
2010/0062612 A1 * 3/2010 Ishikawa ................ 438/778

FOREIGN PATENT DOCUMENTS

TW 200600984 1/2006
WO 2008/004584 1/2008

OTHER PUBLICATIONS

International Search Report—PCT/JP2009/050634 dated Apr. 14, 2009.

* cited by examiner

FIG. 2
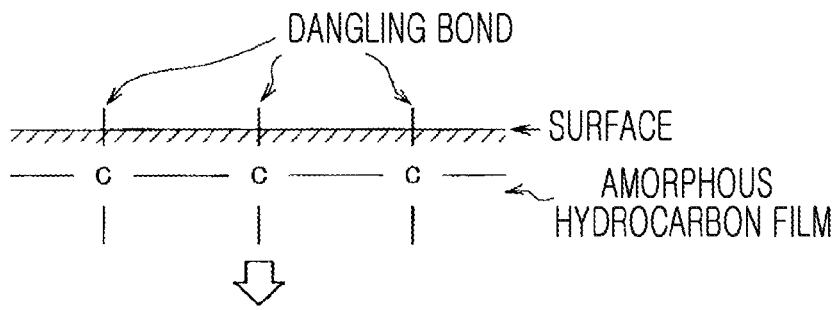
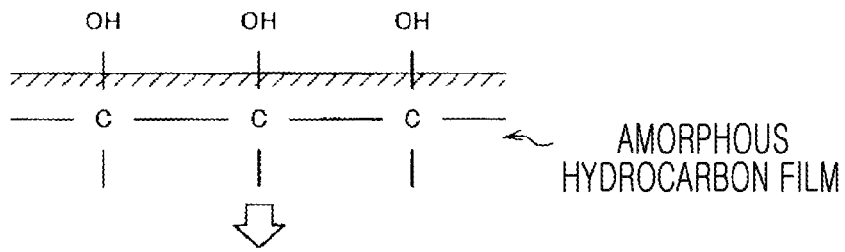
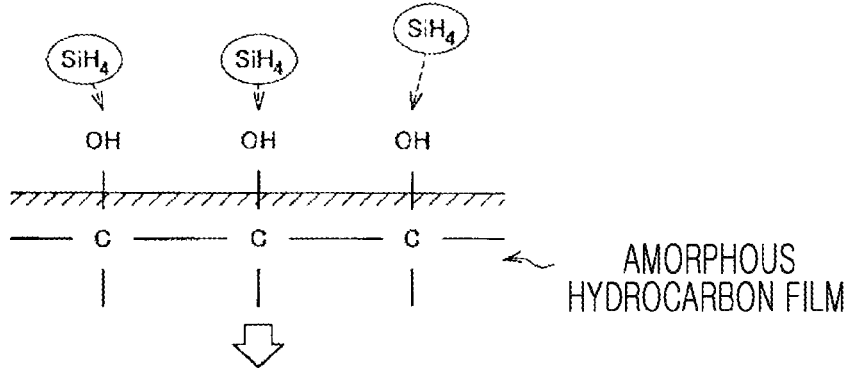
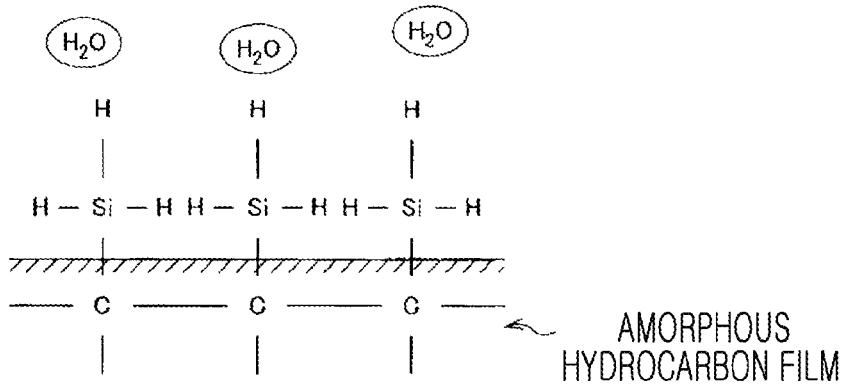

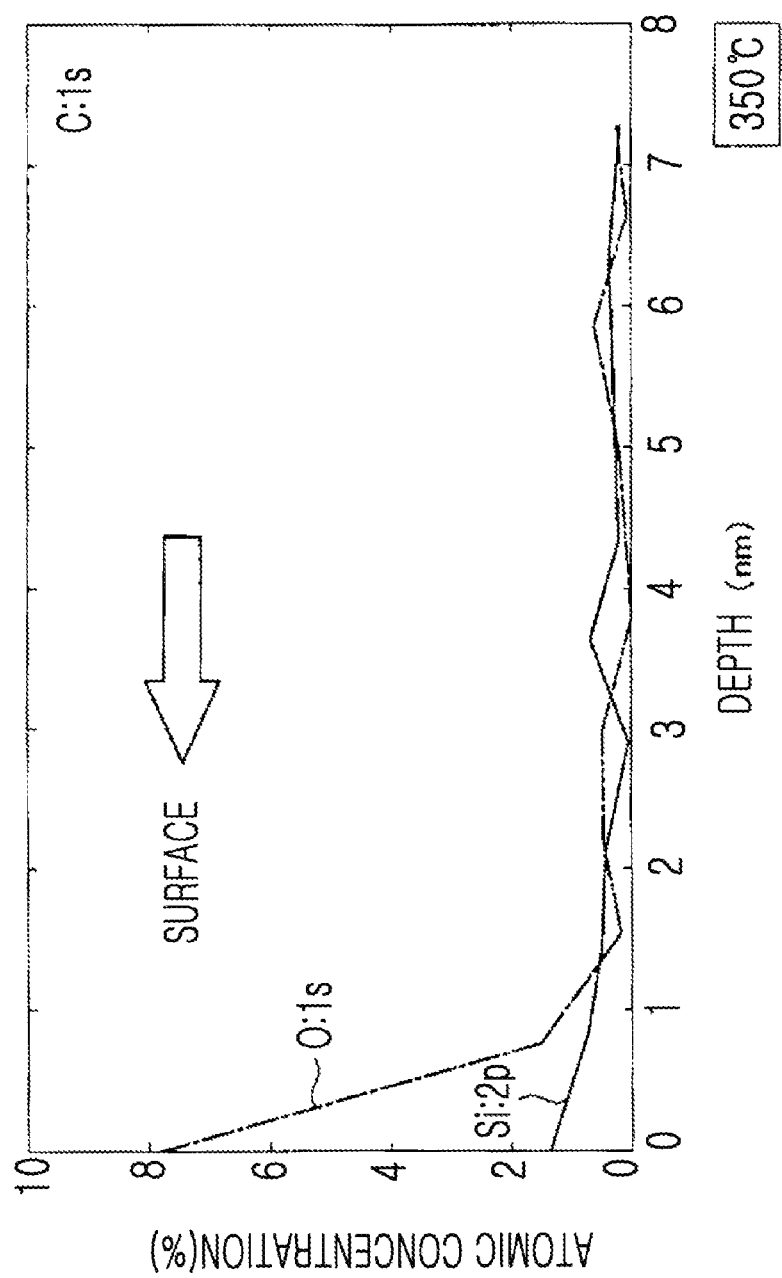

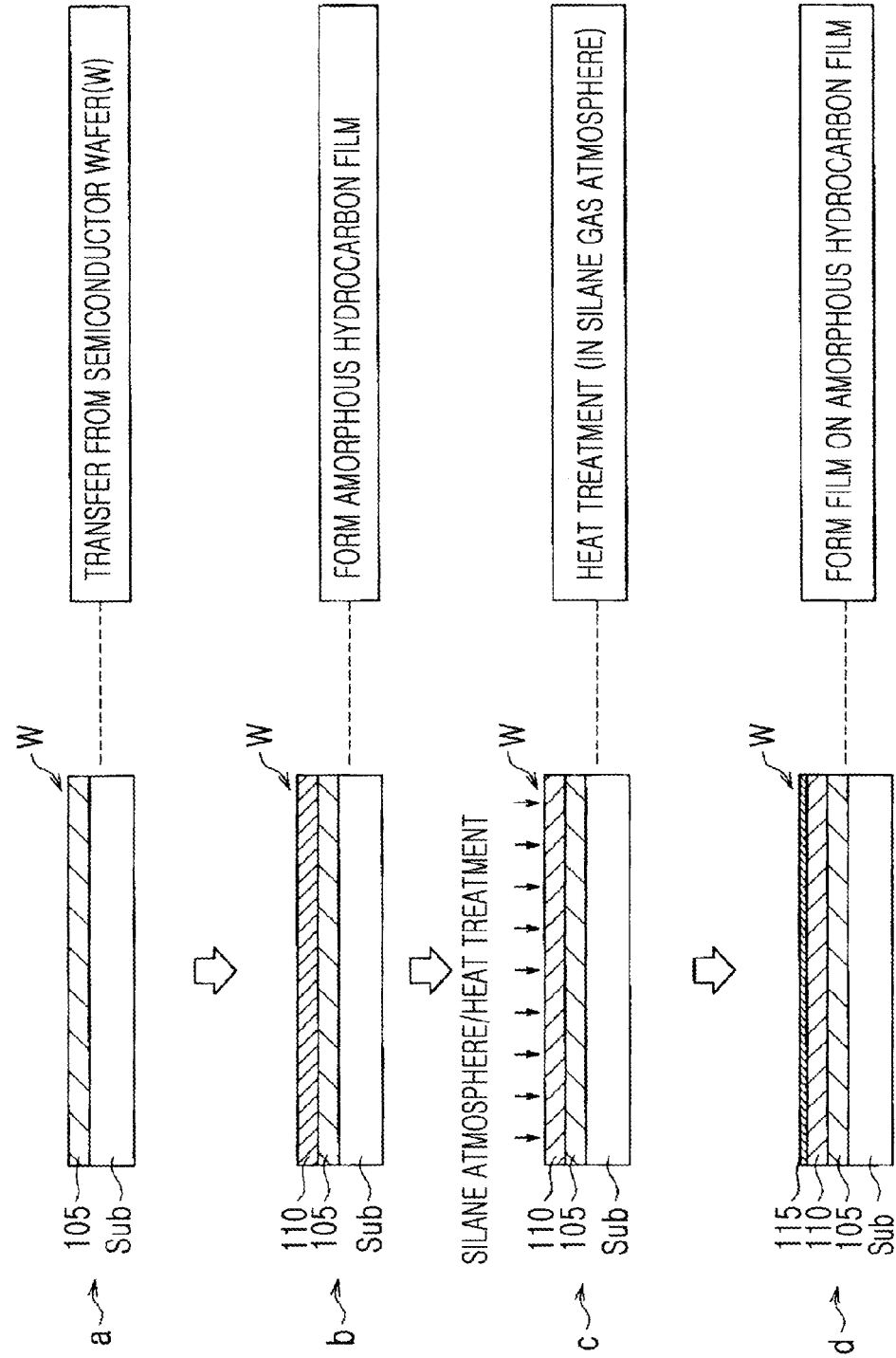

FIG. 9
a → HEAT TREATMENT (IN SILANE GAS ATMOSPHERE)
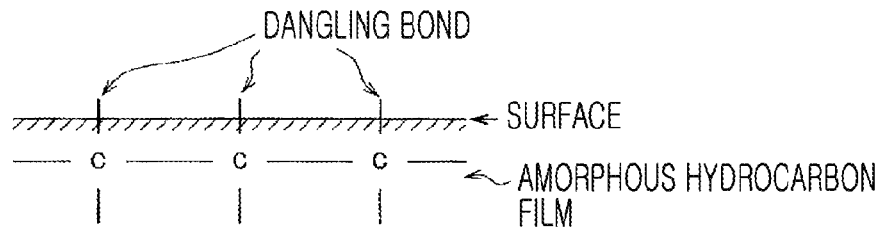
⇩
b → HEAT TREATMENT (IN SILANE GAS ATMOSPHERE: CONTINUED)
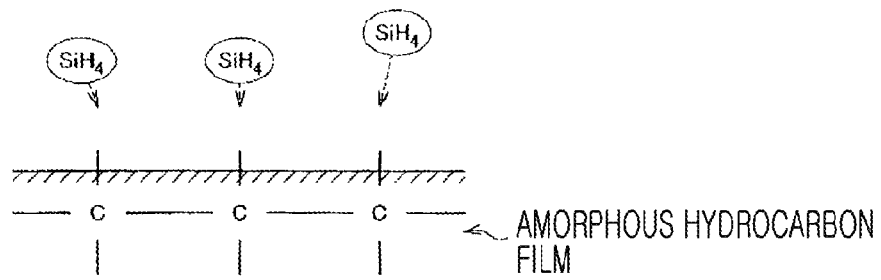
⇩
c → Si-C BOND
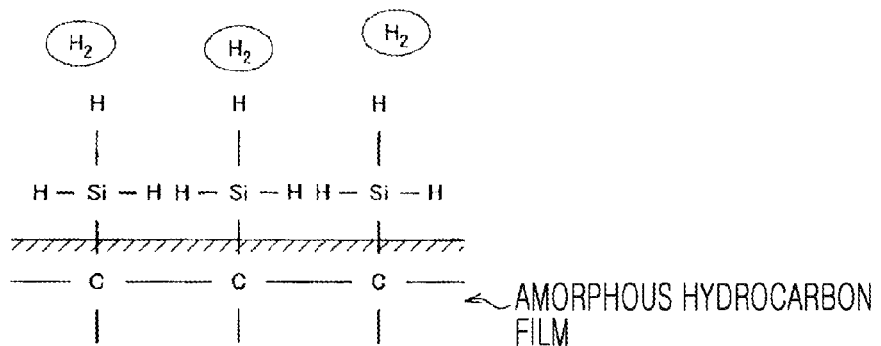

FIG. 10
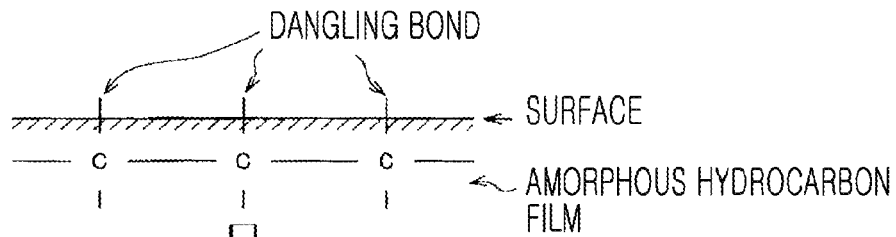
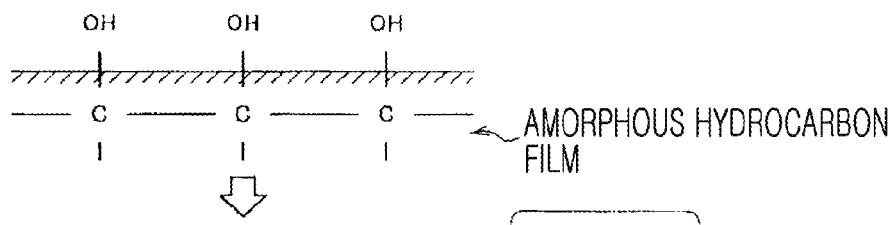
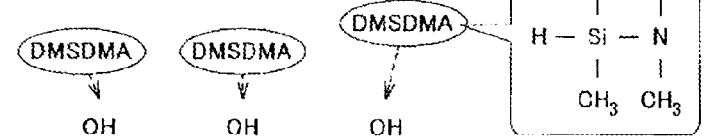
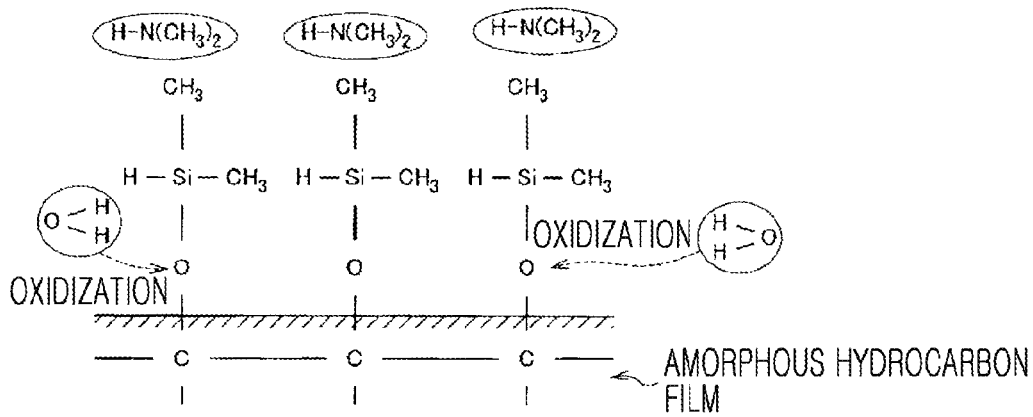

METHOD OF AFTERTREATMENT OF AMORPHOUS HYDROCARBON FILM AND METHOD FOR MANUFACTURING ELECTRONIC DEVICE BY USING THE AFTERTREATMENT METHOD

TECHNICAL FIELD

The present invention relates to a method of aftertreatment of an amorphous hydrocarbon film, and a method for manufacturing an electronic device by including the aftertreatment method, and more particularly, to a method for manufacturing an electronic device, which is appropriate for forming a mask while the electronic device is being manufactured.

BACKGROUND ART

When an electronic device is manufactured, wirings are stacked by forming an interlayer insulation film between wiring layers, to improve high integration of the electronic device. In the conventional art, a silicon oxide film ($SiO_2$ film) is generally used as such an interlayer insulation film. However, recently, a relatively low-permittivity film (low-k film) is demanded due to continuous demands for higher rate of semiconductor devices. For example, such a low-permittivity film is formed of silicon (Si) based organic material containing Si, O, and C.

However, such a silicon based low-k film is expensive and has difficulties in performing etching thereon with high selectivity with respect to other films. Therefore, an amorphous hydrocarbon film, to which hydrogen is added, is being focused as a low-k film without such problems (e.g. refer to patent document 1). An amorphous hydrocarbon film is formed through CVD (Chemical Vapor Deposition) by using hydrocarbon gas, for example, as a process gas. The amorphous hydrocarbon film formed as described above is inexpensive and expected as a prime low-k interlayer insulation film in the future.

Patent Document 1

Japanese Laid-Open Patent Publication No. 2002-12972

DISCLOSURE OF THE INVENTION

Technical Problem

However, after an amorphous hydrocarbon film is formed, a heat treatment (e.g. annealing) is performed on the amorphous hydrocarbon film at a temperature from about 350° C. to about 400° C. to prevent deterioration of each of layers and changes in dimensions. Accordingly, when heat is applied to the amorphous hydrocarbon film, bonds of relatively less heat-resistant portions on surfaces of the amorphous hydrocarbon film may be broken, and thus portions of the amorphous hydrocarbon film may be peeled off. As a result, dangling bonds may be formed (operation a of FIG. 2).

In this case, if the amorphous hydrocarbon film is exposed to the air, oxygen or moisture in the air is combined with the dangling bonds on the surfaces of the amorphous hydrocarbon film, and thus the amorphous hydrocarbon film is oxidized. As a result, polar functional groups, e.g. carbonyl groups or hydrogen groups, are formed on the outermost surface of the amorphous hydrocarbon film (operation b of FIG. 2). Due to the functional group, the permittivity of the amorphous hydrocarbon film increases, and thus processing speed of an electronic device may decrease, adhesion of metal wirings may be deteriorated, or refractive index may be significantly changed, so that desired properties of an electronic device may not be acquired.

To solve the problems as described above, the present invention provides a method of aftertreatment of an amorphous hydrocarbon film, which is performed to protect surfaces of the amorphous hydrocarbon film, and a method for manufacturing an electronic device by including the aftertreatment method. Furthermore, the present invention provides a computer readable storage medium having recorded thereon a control program for implementing the methods, and a treating system for implementing the methods.

Technical Solution

In other words, to solve the problems as described above, according to an aspect of the present invention, there is provided a method of aftertreatment of an amorphous hydrocarbon film, the method including formation of an amorphous hydrocarbon film on a substrate and performing a heat treatment on the formed amorphous hydrocarbon film in a $Si_xH_y$ based gas atmosphere while supplying a $Si_xH_y$ based gas at desired time points.

As described above, when a heat treatment is performed on an amorphous hydrocarbon film, bonds of relatively less heat-resistant portions may be broken, and thus dangling bonds may be formed (the operation a of FIG. 2). If an amorphous hydrocarbon film in this state is exposed to an atmosphere of existence of moisture or hydroxyl in the air or the like, dangling bonds and hydroxyl groups are combined, and thus surfaces of the amorphous hydrocarbon film are oxidized (the operation b of FIG. 2).

However, according to a present technical configuration, a heat treatment is performed on an amorphous hydrocarbon film in a $Si_xH_y$ based gas atmosphere. During the heat treatment, vapor of the $Si_xH_y$ based gas is contacted to surfaces of the amorphous hydrocarbon film. Therefore, as hydroxyl groups on the surfaces of the amorphous hydrocarbon film and hydrogen atoms of the $Si_xH_y$ based gas engage in a chemical reaction, OH groups are substituted with silicon atoms and becomes Si—C bonds. In other words, functional groups with high polarities, such as hydroxyl groups, existing on the outermost surface of an amorphous hydrocarbon film are substituted by groups containing silicon, that is, Si—C bonds (refer to operations c and d of FIG. 2).

As a result, even if an amorphous hydrocarbon film is exposed to an atmosphere containing oxygen and hydrogen (e.g. the air), materials, to which hydroxyl groups or moisture are combined, barely exists on the outermost surface of the amorphous hydrocarbon film, and thus increases of functional groups, such as hydroxyl groups or the like, with the lapse of time may be prevented. As a result, an amorphous hydrocarbon film may be prevented from being oxidized, and thus electrical characteristics, such as permittivity or the like, and physical characteristics, such as adhesion or the like, of the amorphous hydrocarbon film may be maintained in good condition.

Especially, comparing the case where a Si—C bond exists on the outermost surface of an amorphous hydrocarbon film to the case where a Si—O bond exists on the outermost surface of an amorphous hydrocarbon film, the electronegativity $\chi(Si)$ of a silicon atom (Si) is 1.90, the electronegativity $\chi(C)$ of a carbon atom (C) is 2.55, and the electronegativity $\chi(O)$ of an oxygen atom (O) is 3.44. Therefore, although both a Si—C bond and a Si—O bond are covalent bonds, a carbon atom or an oxygen atom has greater force of attracting electrons than that of a silicon atom, and thus either of the bonds becomes a polarized bond in which electrons are slightly transferred from a silicon atom to a carbon atom or an oxygen atom.

Furthermore, the difference of electronegativities $\chi$ of a Si—O bond is 1.54, which is more than twice of the difference of electronegativities $\chi$ of a Si—C bond, that is, 0.65. The result indicates that the number of electrons transferred from silicon atom to oxygen atom is greater than the number of electrons transferred from silicon atom to carbon atom, that is, a Si—O bond has higher polarity (polarization, ion character) than a Si—C bond.

Meanwhile, in case of an O—H bond, since the electronegativity $\chi(H)$ of hydrogen atom is 2.20 and the electronegativity $\chi(O)$ of oxygen atom is 3.44, the difference of electronegativities $\chi$ of an O—H bond is 1.24, which is also nearly twice of the difference of electronegativities $\chi$ of a Si—C bond. Therefore, an O—H bond also has higher polarity than a Si—C bond.

Therefore, for example, even in the case where an amorphous hydrocarbon film is heat treated as shown in the operation a of FIG. 10 and OH groups are attached to the surfaces of the amorphous hydrocarbon film as the amorphous hydrocarbon film is exposed to the air as shown in the operation b of FIG. 10, and the OH groups are reduced and are substituted by Si—O bonds by silylating the amorphous hydrocarbon film by using a silylating agent, such as DMSDMA or the like, as shown in the operation c of FIG. 10, as shown in the operation d of FIG. 10, since a Si—O bond has higher polarity than a Si—C bond, when moisture ($H_2O$) or a hydroxyl (OH) group approaches to around a Si—O bond, the Si—O bond may easily engage in a chemical reaction with moisture or a hydroxyl group, either of which has higher polarity as the Si—O bond than that of a Si—C bond, and thus surfaces of the amorphous hydrocarbon film may be oxidized again.

Meanwhile, as described above, a Si—C bond has relatively low polarity, and thus the state of covalent bonding is closed to nonpolar bonding. Therefore, even if moisture or a hydroxyl group with relatively high polarity approaches to an amorphous hydrocarbon film after heat treatment of the amorphous hydrocarbon film (in a non-silane gas atmosphere) (the operation a of FIG. 2), exposure of the amorphous hydrocarbon film to the air (the operation b of FIG. 2), and heat treatment of the amorphous hydrocarbon film (in a silane gas atmosphere) (the operation c of FIG. 2), it is difficult to have a chemical reaction (reduction reaction) as shown in the operation d of FIG. 2, and thus oxidization of the amorphous hydrocarbon film may be prevented. As described above, deterioration of an amorphous hydrocarbon film due to moisture may be further prevented by having Si—C bonds on the outermost surfaces of the amorphous hydrocarbon film than by having Si—O bonds on the outermost surfaces of the amorphous hydrocarbon film, and thus electrical characteristics, such as permittivity or the like, and physical characteristics, such as adhesion or the like, of the amorphous hydrocarbon film may be maintained in better condition.

A desired time point for supplying a $Si_xH_y$ based gas may be either simultaneously as a heat treatment begins or during a heat treatment. For example, a heat treatment in a $Si_xH_y$ based gas atmosphere may be performed immediately after a heat treatment is performed on the amorphous hydrocarbon film in a non-$Si_xH_y$ based gas atmosphere. Meanwhile, if a $Si_xH_y$ based gas is supplied simultaneously as a heat treatment begins, surfaces of an amorphous hydrocarbon film may be protected with Si—C bonds without oxidizing the surfaces of the amorphous hydrocarbon film with hydroxyl groups or the like, as shown in the operations a through c of FIG. 9. Therefore, oxidization of surfaces of an amorphous hydrocarbon film may be prevented more effectively.

The $Si_xH_y$ based gas may include any one of monomethylsilane, dimethylsilane, or trimethylsilane. The heat treatment in a $Si_xH_y$ based gas atmosphere may be performed at a temperature from 200° C. to 400° C.

The heat treatment in a $Si_xH_y$ based gas atmosphere may be performed for from 10 minutes to 30 minutes. Furthermore, the heat treatment in a $Si_xH_y$ based gas atmosphere may be performed under a pressure from the atmospheric pressure to 1 Torr. Furthermore, the atmospheric pressure refers to the state of 0° C., 1 atm(=$1.013 \times 10^5$ Pa). The heat treatment in a non-$Si_xH_y$ based gas atmosphere may be annealing.

The heat treatment in a $Si_xH_y$ based gas atmosphere may be preferably performed on an amorphous hydrocarbon film having a thickness less than or equal to 10 nm. If a thickness of an amorphous hydrocarbon film is above 10 nm, permittivity of the amorphous hydrocarbon film increases, and thus high rate of an electronic device cannot be made.

According to another aspect of the present invention, there is provided a method for manufacturing an electronic device, the method including forming an amorphous hydrocarbon film on a substrate, and performing a heat treatment on the formed amorphous hydrocarbon film in a $Si_xH_y$ based gas atmosphere while supplying the $Si_xH_y$ based gas at desired time points.

According to the method, a heat treatment is performed on the amorphous hydrocarbon film in a $Si_xH_y$ based gas atmosphere while supplying the $Si_xH_y$ based gas at desired time points. That is, during a heat treatment, vapor of $Si_xH_y$ based gas is contacted to surfaces of the amorphous hydrocarbon film at desired time points. Therefore, even if bonds of relatively less heat-resistant portions on surfaces of the amorphous hydrocarbon film are broken and become dangling bonds, Si—C bonds may be formed on the surfaces of the amorphous hydrocarbon film by the dangling bonds and silicon atoms. As a result, increases of functional groups, such as hydroxyl groups or the like, with the lapse of time due to absorption of hydroxyl groups or moisture onto surfaces of an amorphous hydrocarbon film may be prevented. As a result, electrical characteristics and physical characteristics of the amorphous hydrocarbon film may be maintained in good condition.

The method may include formation of a predetermined film on the amorphous hydrocarbon film after the heat treatment in a $Si_xH_y$ based gas atmosphere. Examples of the predetermined films may include a $SiO_2$ film, a SiN film, a SiCN film, a SiCO film, a metal film containing Cu, Ti, Ta, W, or the like, or the like, which functions as a capping film or a hard mask.

The heat treatment in a $Si_xH_y$ based gas atmosphere may be performed at a temperature from 200° C. to 400° C. Furthermore, the amorphous hydrocarbon film may be an interlayer insulation film.

To solve the problems as described above, according to another aspect of the present invention, there is provided a computer readable storage medium having recorded thereon a control program for implementing the method of aftertreatment of an amorphous hydrocarbon film on a computer.

According to another aspect of the present invention, there is provided a computer readable storage medium having recorded thereon a control program for implementing the method for manufacturing an electronic device on a computer.

Furthermore, according to another aspect of the present invention, there is provided a treating system for manufacturing an electronic device, the treating system including a film formation processing apparatus and a heat treatment processing apparatus, which form an amorphous hydrocarbon film. The treating system forms an amorphous hydrocarbon film on a substrate by using the film formation processing apparatus, and thus the treating system performs a heat treatment on the amorphous hydrocarbon film by using the heat treatment processing apparatus in a $Si_xH_y$ based gas atmosphere while supplying the $Si_xH_y$ based gas at desired time points.

According to the present invention, by engaging dangling bonds, which are formed on surfaces of an amorphous hydrocarbon film during a heat treatment, and silicon atoms in a chemical reaction. Therefore, regardless of later operations, characteristics of an electronic device may be favorably maintained.

Advantageous Effects

As described above, according to the present invention, the surfaces of an amorphous hydrocarbon film may be prevented from being oxidized by forming Si—C bonds on the surfaces of the amorphous hydrocarbon film.

BRIEF DESCRIPTION OF THE DRAWINGS

FIG. 2 is a diagram for describing state of a surface layer of an amorphous hydrocarbon film after performing aftertreatment of the amorphous hydrocarbon film according to the first embodiment of the present invention is performed thereon.

FIG. 7A is a diagram showing concentrations of each of atoms in a surface layer of an amorphous hydrocarbon film acquired by performing aftertreatment on the amorphous hydrocarbon film formed by changing temperature condition.

FIG. 8 is a diagram showing a process of manufacturing an electronic device, the process including a method of aftertreatment of an amorphous hydrocarbon film, according to a second embodiment of the present invention.

FIG. 9 is a diagram for describing state of a surface layer of an amorphous hydrocarbon film after performing aftertreatment according to the second embodiment of the present invention.

FIG. 10 is a diagram for describing state of a surface layer of an amorphous hydrocarbon film after silylation is performed thereon as aftertreatment.

DESCRIPTION OF REFERENCE NUMERALS

105: low-k film
110: amorphous hydrocarbon film
200: process controller
200a: CPU
200b: ROM
200c: RAM
PM1: amorphous hydrocarbon film formation processing apparatus
PM2: heat treatment processing apparatus (in non-silane gas atmosphere)
PM3: heat treatment processing apparatus (in silane gas atmosphere)
PM4: film formation processing apparatus
Sub: silicon substrate
Sys: treating system Best Mode For Carrying Out The Invention Hereinafter, embodiments of the present invention will be described in details with reference to the accompanying drawings. Furthermore, in a following description and accompanying drawings, repeated description for elements having the same configuration and functions will be omitted by marking the same mark. Furthermore, it is assumed herein that 1 mTorr is $(10^{-3}\times 101325/760)$ Pa and 1 sccm is $(10^{-6}/60)$ m$^3$/sec under conditions of 0° C. and 1 atm.

(First Embodiment)

First, a method for manufacturing an electronic device by including a method of aftertreatment of an amorphous hydrocarbon film according to a first embodiment of the present invention will be described below with reference to FIG. 1, which is a cross-sectional view of each of operations and a sequence of the operations.

Figure 1:
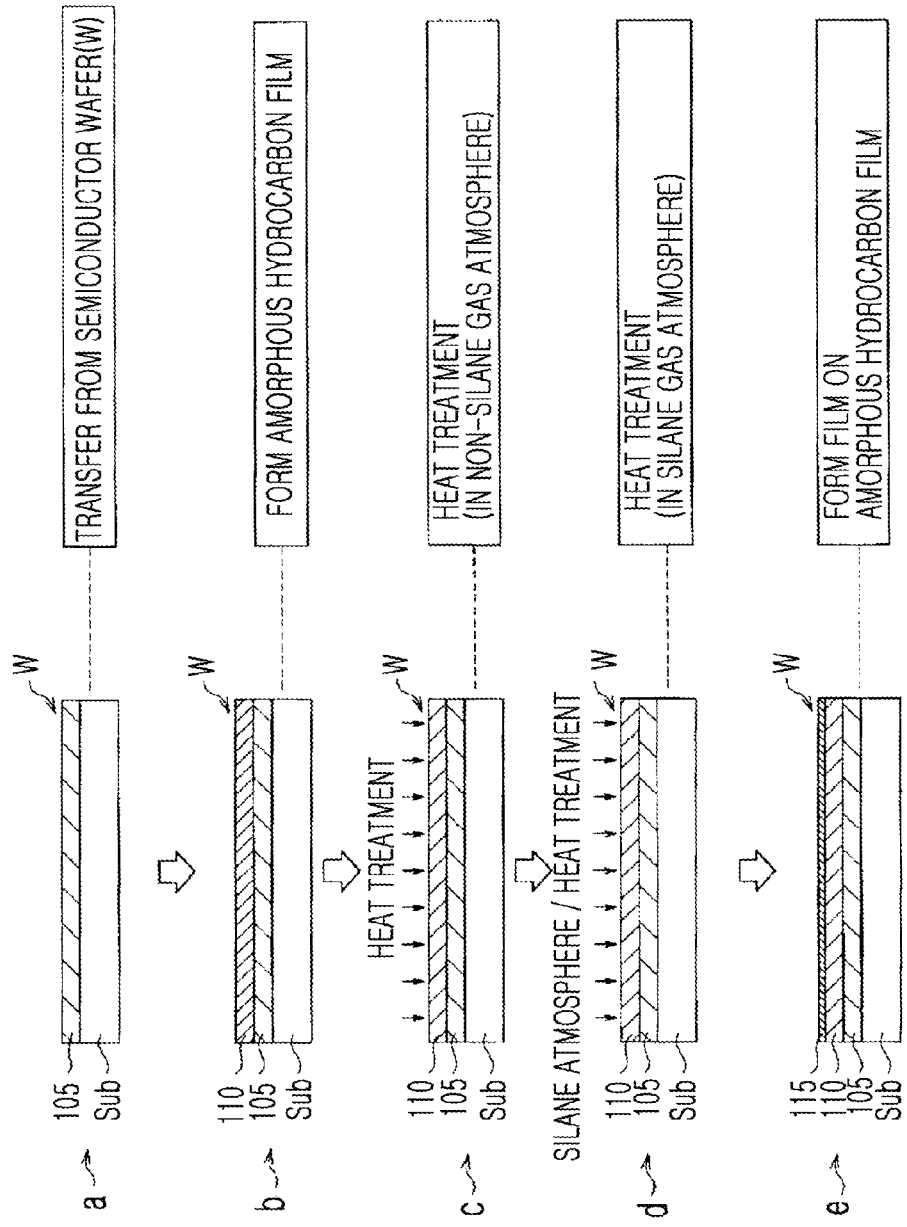
FIG. 1 is a diagram showing a process of manufacturing an electronic device, the process including a method of aftertreatment of an amorphous hydrocarbon film, according to a first embodiment of the present invention.

First, in the operation a of FIG. 1, a semiconductor wafer W is carried into a film formation processing apparatus for forming an amorphous hydrocarbon film. In the semiconductor wafer, as an underlayer, e.g. a SiCO based low-k film 105, is formed on a silicon substrate Sub. Next, an amorphous hydrocarbon film 110 is formed on the low-k film 105 in the operation b of FIG. 1. The amorphous hydrocarbon film 110 may be preferably formed through CVD. However, the present invention is not limited thereto.

In this case, a hydrocarbon gas, such as propylene ($C_3H_6$), propane ($C_3H_4$), propane ($C_3H_8$), butane ($C_4H_{10}$), butylene ($C_4H_8$), butadiene ($C_4H_6$), or acetylene ($C_2H_2$), or the like, or a gas mainly based on any of the compounds may be used as a process gas. By using such a process gas, an amorphous hydrocarbon film may be formed by using the method disclosed in Japanese Laid-Open Patent Publication No. 2002-12972, for example. Furthermore, strong carbon networks may be formed by adding oxygen to a process gas even in film formation at a relatively low temperature.

After the formation of the amorphous hydrocarbon film 110, as shown in the operation c of FIG. 1, the amorphous hydrocarbon film is heat treated, such as annealing (not in a silane gas atmosphere). The treatment is performed under suitable conditions according to an electronic device (semiconductor device) to be acquired, and is generally performed in a non-oxidizing atmosphere (a vacuum atmosphere or an inert gas atmosphere, such as an Ar gas atmosphere, a $N_2$ gas atmosphere or the like) at a temperature from about 350° C. to about 400° C.

Surface condition of the amorphous hydrocarbon film 110 immediately after being formed is healthy, and thus no change occurs thereon as time passes even if the amorphous hydrocarbon film 110 is exposed to the air. However, after the amorphous hydrocarbon film 110 performed heat treatment, e.g. annealing or the like, as described above, bonds of relatively less heat-resistant portions on surfaces of the amorphous hydrocarbon film 110 are broken, and thus portions of the amorphous hydrocarbon film are peeled off. As a result, dangling bonds may be formed on the surface layer of the amorphous hydrocarbon film 110, as shown in the operation a of FIG. 2.

In this case, if the amorphous hydrocarbon film 110 is exposed to the air, oxygen or moisture reacts with portions of the broken bonds in a relatively short period of time, and reactions, such as —C—C.+$O_2$→—C—C=O+O*, —C—CH+O*→—C—C—OH, —C—C.+$H_2O$ →—C—C—OH+H or the like occur. Therefore, the broken bonds are oxidized. As a result, as shown in the operation b of FIG. 2, polar functional groups, such as carbonyl groups or hydroxyl groups, are formed in the amorphous hydrocarbon film 110, and such functional groups increase as time passes. Such functional groups absorbs moisture or significantly changes electrical characteristics, such as permittivity or the like, or other characteristics.

For example, the amorphous hydrocarbon film 110 has a relative permittivity (k) of about 2.8 after being formed. Immediately after the amorphous hydrocarbon film 110 is annealed at a temperature around 400° C., the amorphous hydrocarbon film 110 has improved relative permittivity (k) of from about 2.6 to about 2.7. However, as the annealed amorphous hydrocarbon film 110 is exposed to the air for more than or equal to about 100 hours, the relatively permittivity (k) exceeds 3, and leakage characteristic of the amorphous hydrocarbon film 110 is also deteriorated. Furthermore, as the amorphous hydrocarbon film 110 is exposed to the air for a long time, a refractive index of the amorphous hydrocarbon film 110 also increases.

To prevent such a change of electrical characteristics or the like with the lapse of time, heat treatment is performed in a silane gas atmosphere immediately after the heat treatment is performed in a non-silane gas atmosphere, according to the present embodiment. As shown in the operations c and d of FIG. 2, the heat treatment is performed to react the polar functional groups, such as hydroxyl groups or the like, formed on the surfaces of the amorphous hydrocarbon film 110 with the silane gas to substitute the functional groups with groups containing silicon (Si) (reduction, Si—C bonding). Therefore, the surfaces of the amorphous hydrocarbon film 110 are protected, and thus it may prevent characteristics of the amorphous hydrocarbon film 110 from being changed as numbers of functional groups, such as hydroxyl groups or the like, increase as time passes.

Although the permittivity (k) slightly increases immediately after such a reduction process, the permittivity (k) is hardly changed even if the amorphous hydrocarbon film 110 is exposed to the air thereafter. The refractive index is also hardly changed even if the amorphous hydrocarbon film 110 is exposed to the air after silylation.

Furthermore, the term "immediately after the heat treatment is performed in a non-silane gas atmosphere" may refer to any time within a period of time during which characteristics of an amorphous hydrocarbon film are hardly deteriorated, after a heat treatment.

As described above, through the aftertreatments of the amorphous hydrocarbon film 110, the surfaces of the amorphous hydrocarbon film 110 are protected. Next, the method proceeds to the operation e of FIG. 1, and a predetermined film 115, which functions as a capping film or a hard mask and is a $SiO_2$ film, a SiN film, a SiCN film, a SiCO film, or a metal film containing Cu, Ti, Ta, W, or the like, is formed on the amorphous hydrocarbon film 110. In this case, since the durability of the amorphous hydrocarbon film 110 has been improved by protection effect due to heat treatment in a silane gas atmosphere in the just previous operation d of FIG. 1, characteristics of amorphous hydrocarbon film are not deteriorated as time passes, and thus an electronic device with favorable characteristics may be manufactured in a series of operations thereafter.

Next, an example of the method for manufacturing an electronic device, the method including the operations as described above, will be described. For example, the case of performing burial of copper (wirings) by using a dual damascene method, that is, the case in which an electronic device having the stacked structure shown in FIG. 3 is acquired by performing etching of holes and trenches and burial of a Cu film from the structure shown in the operation d of FIG. 2 will be described.

Figure 3:
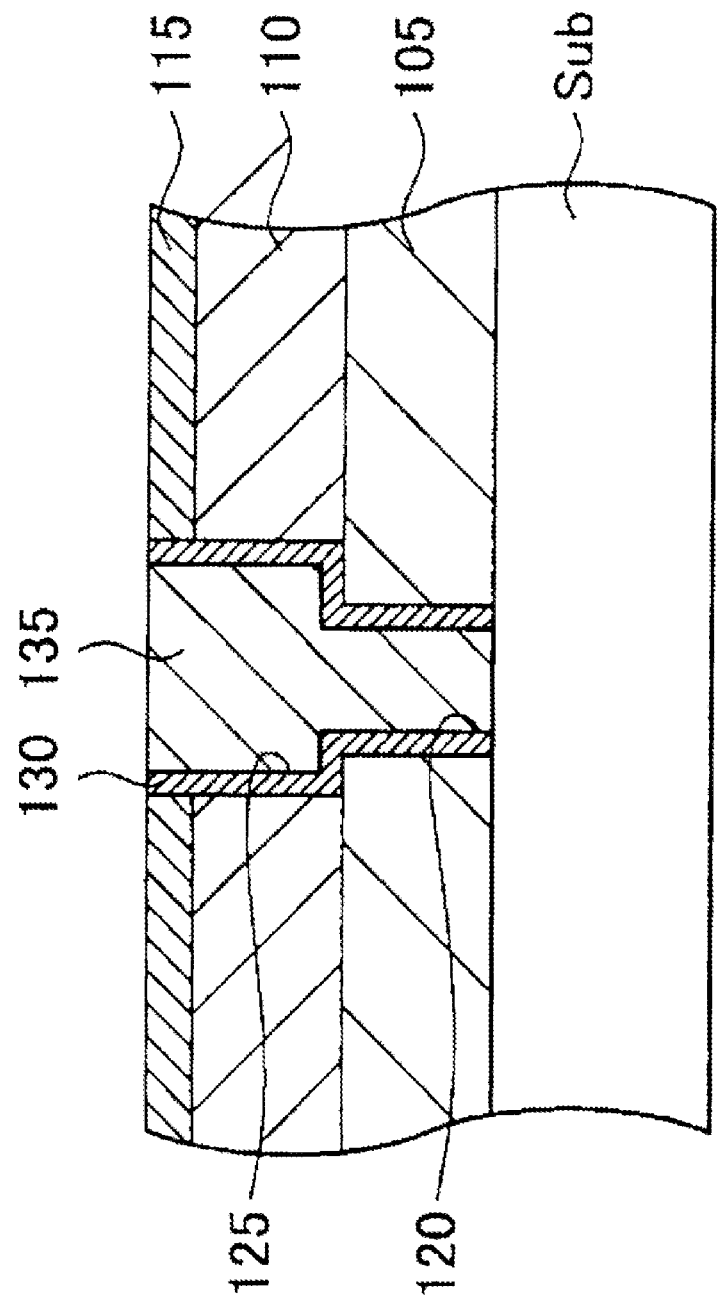
FIG. 3 is a cross-sectional view showing an example of structures acquired in a method of manufacturing an electronic device according to embodiments of the present invention.

After the heat treatment (in a silane gas atmosphere) in the operation d of FIG. 1 is performed, the structure shown in the operation e of FIG. 1 is formed by forming a hard mask as the film 115, a hole 120 and a trench 125 are respectively formed in the low-k film 105 and the amorphous hydrocarbon film 110 through etching operations, and a barrier film 130 and a Cu film 135 are formed (FIG. 3).

Figure 4:
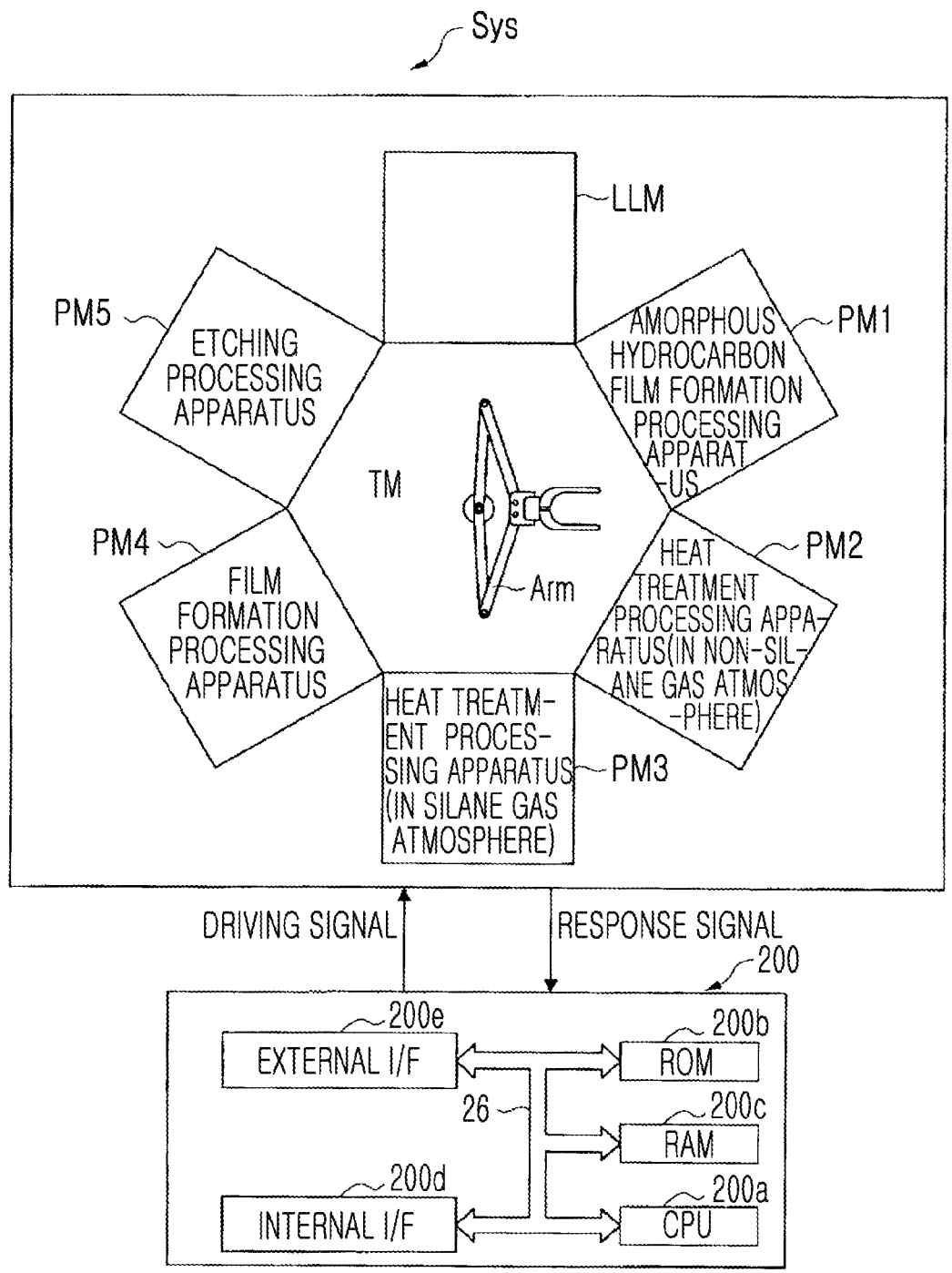
FIG. 4 is a diagram showing a cluster-type treating system and a process controller according to embodiments of the present invention.

Next, a treating system for performing a series of the operations shown in FIG. 1 will be described with reference to FIG. 4. The treating system Sys belongs to a cluster-type apparatus group, and includes an amorphous hydrocarbon film formation processing apparatus PM1, a heat treatment processing apparatus PM2, a heat treatment processing apparatus PM3, a film formation processing apparatus PM4, and an etching processing apparatus PM5.

The amorphous hydrocarbon film formation processing apparatus PM1 forms an amorphous hydrocarbon film on a predetermine film, e.g. a SiCO based low-k film, formed on a semiconductor wafer. The heat treatment processing apparatus PM2 performs a heat treatment on the semiconductor wafer, on which the amorphous hydrocarbon film is formed, in a non-silane gas atmosphere. Examples of heat treatments in a non-silane gas atmosphere may include annealing.

The heat treatment processing apparatus PM3 performs a heat treatment on the amorphous hydrocarbon film in a silane gas atmosphere after the above heat treatment. The film formation processing apparatus PM4 forms a predetermined film on the amorphous hydrocarbon film after the heat treatment in a silane gas atmosphere. The etching processing apparatus PM5 forms a hole or a trench at a desired location using etching gas. Furthermore, the treating system Sys carries a semiconductor wafer from a desired depressurized load-lock chamber LLM and transfers the semiconductor wafer between processing apparatuses by using an arm Arm arranged in a transfer chamber TM.

Each of the processing apparatuses are batch-controlled by a process controller 200, which includes a microprocessor (CPU) 200a, memories (ROM 200b and RAM 200c), and interfaces (internal interface 200d and external interface 200e). A bus 26 is also included.

A keyboard used for a process manager to input commands for managing each of the processing apparatuses, or a display apparatus for visually displaying operating state of each of the processing apparatuses, is connected to the process controller 200 via the interfaces. Furthermore, a control program, which defines processes executed by each of the processing apparatuses, or a recipe, which stores process condition data or the like, is stored in memory regions, such as the ROM 200b and the RAM 200c. The CPU 200a receives an instruction from an operator or the like and controls processes executed by each of the processing apparatuses by using the control program and related data stored in any memory region. Furthermore, the recipe may be either stored in a readable storage medium, such as a CD-ROM, a hard disk, a flexible disk, a non-volatile memory, or the like, or received from an external apparatus connected via a network.

Figure 5:
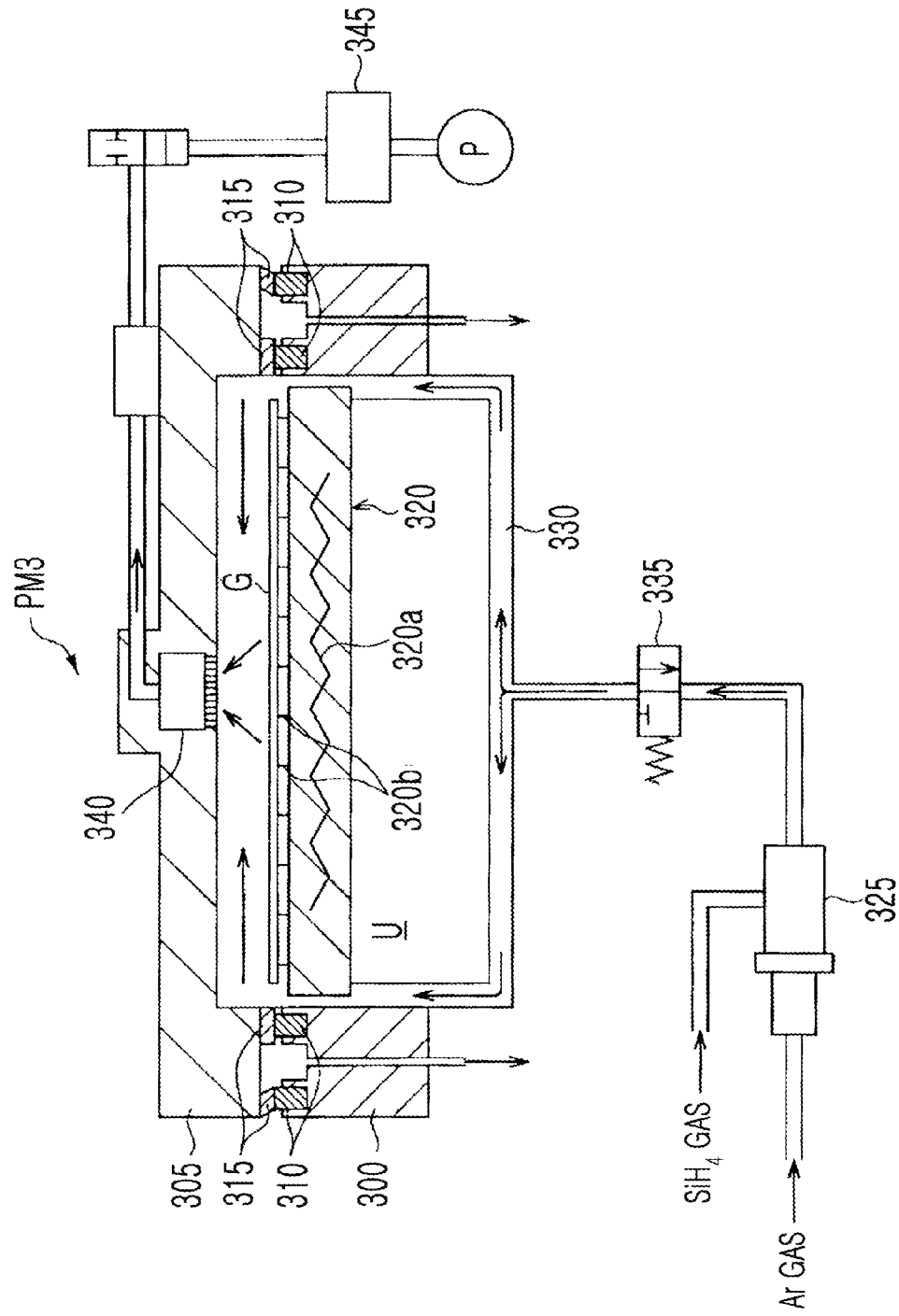
FIG. 5 is a cross-sectional view of a heat treatment processing apparatus (in a silane gas atmosphere) (PM3) in the treating system shown in FIG. 4.

Next, the internal configuration and the operations of an apparatus for performing aftertreatment of an amorphous hydrocarbon film will be described. FIG. 5 is a cross-sectional view of the heat treatment processing apparatus PM3 for performing a heat treatment in a silane gas atmosphere. Furthermore, although detailed descriptions on other processing apparatuses are omitted, apparatuses well-known in the art may be used therefor.

The heat treatment processing apparatus PM3 includes a container 300 and a cover unit 305. First shield rings 310 are formed on the inner and outer circumferential sides of the upper portion of the outer circumference of the container 300. Furthermore, second shield rings 315 are formed on the inner and outer circumferential sides of the lower portion of the outer circumference of the cover unit 305. When the container 300 is covered from above by the cover unit 305, the first shield rings 310 and the second shield rings 315 tightly contact each other in the inner and outer circumferential sides, and a processing chamber U, which is held airtight, is formed by depressurizing the space between the first shield rings 310 and the second shield rings 315.

A hot plate 320 is formed in the container 300. A heater 320a is buried in the hot plate 320, and the heater 320a adjusts the internal temperature of the processing chamber U to a desired temperature. Pins 320b, which support a glass substrate G, are elevatably formed on the top surface of the hot plate 320, and thus a substrate may be easily transferred and pollution of the rear surface of the substrate may be prevented.

Silane gas is vaporized by a vaporizer 325, becomes vaporized molecules, passes a gas flowing path 330 by using argon (Ar) gas as a carrier gas, and is supplied to the upper portion of the processing chamber U from the surroundings of the hot plate 320. The supply of silane gas is controlled by opening and closing an electronic valve 335. An exhaust port 340 is formed roughly at the center of the upper portion of the cover unit 305 to evacuate silane gas and argon gas supplied into the processing chamber U to the outside by using a pressure controller 345 and a vacuum pump P. Alternatively, when the processing apparatus is arranged upside down, silane gas may be supplied to the lower portion of the processing chamber U from the surroundings of the hot plate 320 by using argon gas as a carrier gas and the silane gas and the argon gas may be evacuated to the outside through an exhaust port 340 formed on the bottom surface of the apparatus by using the pressure controller 345 and the vacuum pump P.

In the heat treatment processing apparatus PM3 configured as described above, based on controls of the process controller 200, the hot plate 320 is controlled to a predetermined temperature, such that the temperature of the vaporizer 325 is in a range between 200° C. and 400° C., and the amounts of gas flow and evacuation of the vacuum pump P are controlled, such that the internal pressure of the processing chamber is around 20 mTorr. In this state, a semiconductor wafer W is loaded on the pins 320b of the hot plate 320 and heat treatment is performed on the amorphous hydrocarbon film 110, which is immediately after heat treatment in a non-silane gas atmosphere, in a silane gas atmosphere as supplying silane gas at the flow rate of 50 sccm, for example, and argon gas at the flow rate of 50 sccm, for example, for from 10 minutes to 30 minutes.

Accordingly, as shown in the operation c of FIG. 2, during the heat treatment in a silane gas atmosphere, vapor of silane gas is contacted to surfaces of the amorphous hydrocarbon film 110, and thus, as shown in the operation d of FIG. 2, functional groups, such as OH groups or the like attached to surfaces of the amorphous hydrocarbon film 110 may be reduced and substituted with stable Si—C bonds. Furthermore, after the heat treatment in a silane gas atmosphere, gas remaining in the processing chamber is evacuated to the outside by the vacuum pump P.

EXPERIMENTS

Next, to prove effect of the method of aftertreatment of an amorphous hydrocarbon film according to the present embodiment, an experiment performed by the present inventor and a result thereof will be described below with reference to FIGS. 6A, 6B, 7A, and 7B.

The inventor has introduced silane gas and argon gas at the ratio of 1:1 at the flow rate of 50 sccm each. Under the condition, the inventor has performed heat treatments (aftertreatment of an amorphous hydrocarbon film) at temperature conditions of the two patterns below.

(1) Temperature 350° C.
(2) Temperature 400° C.

Figure 6A:
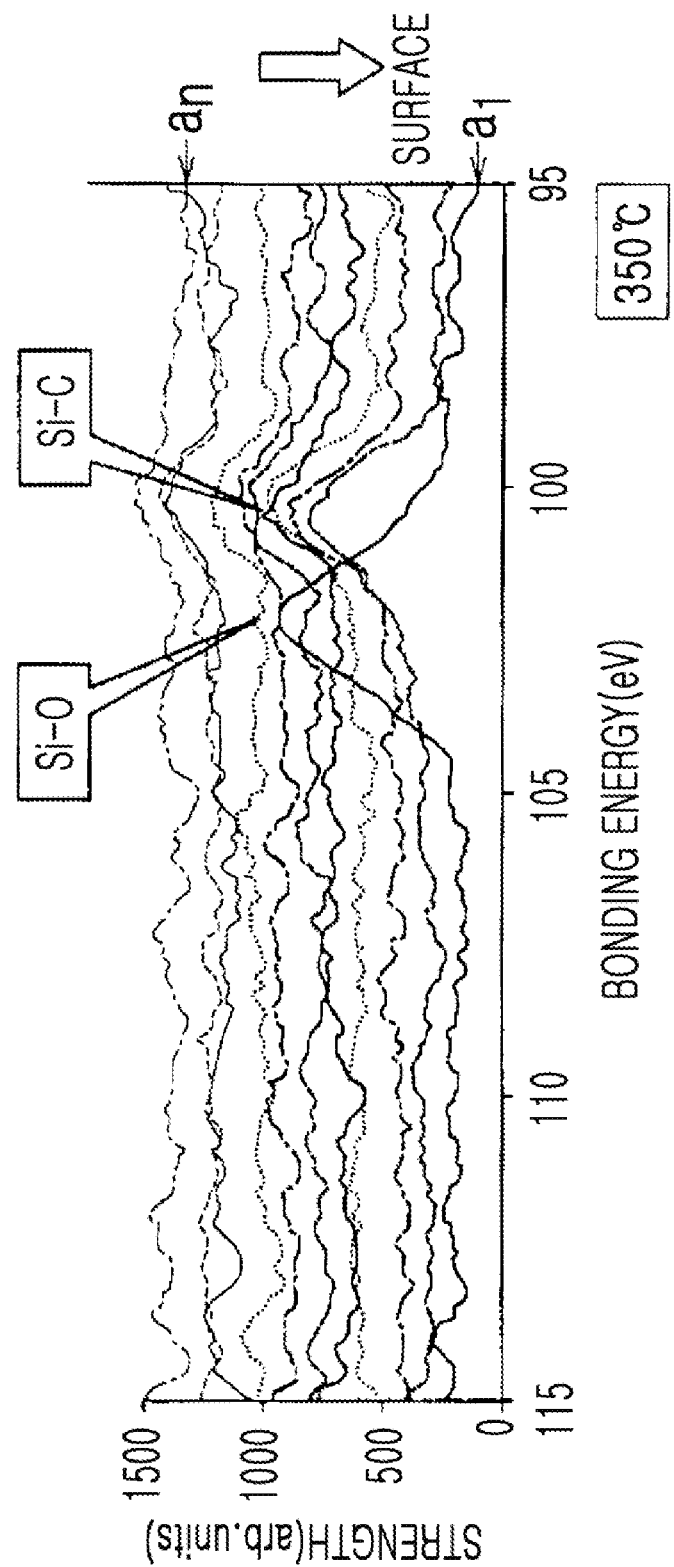
FIG. 6A is a diagram showing bonding state of atoms in a surface layer of an amorphous hydrocarbon film acquired by performing aftertreatment on the amorphous hydrocarbon film formed by changing temperature condition.
Figure 6B:
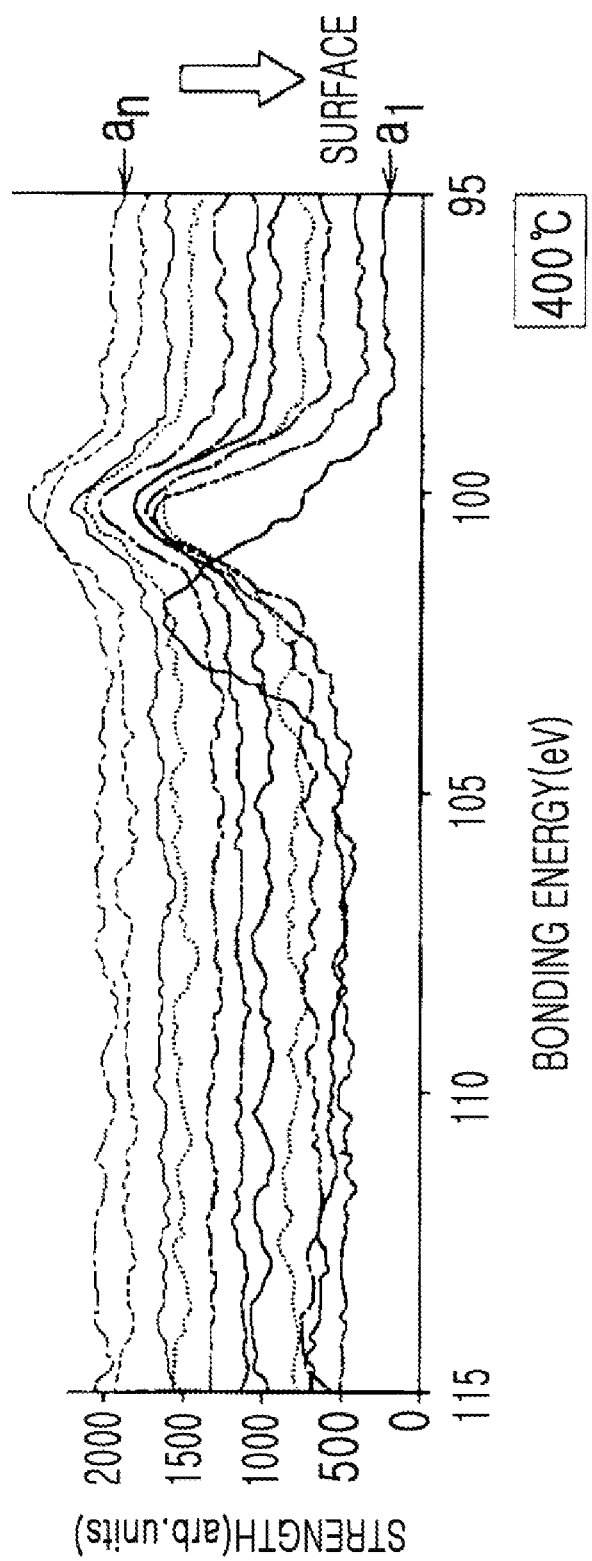
FIG. 6B is a diagram showing bonding state of atoms in a surface layer of an amorphous hydrocarbon film acquired by performing aftertreatment on the amorphous hydrocarbon film formed by changing temperature condition.

FIGS. 6A and 6B are graphs respectively showing results of measuring strength (vertical axis) of bonding energy (horizontal axis) of materials appearing on surfaces of amorphous hydrocarbon films at each of cutting stages, when layers from outermost surface layer ($a_1$) to $a_n$ (n=11) of the amorphous hydrocarbon film are gradually cut to confirm the state of the amorphous hydrocarbon film, under the temperature conditions (1) and (2). In each of the graphs, a curved line drawn at a lower location indicates the state of the amorphous hydrocarbon film closer to the surface of the amorphous hydrocarbon film.

As a result of the experiments, under either of the temperature conditions, strengths were high around 102 eV, which is the bonding energy of a Si—O bond, at the outermost surface layer a1 of the amorphous hydrocarbon film, whereas strengths were high around 100 eV, which is the bonding energy of a Si—C bond, at layers ($a_{1+1}$ through $a_n$) of the other depths.

Therefore, by performing the heat treatment in a silane gas atmosphere stated above, the inventor proved that silane gas is dissociated at the temperatures stated above, engaged in a chemical reaction with hydroxyl (OH) groups existing on surfaces of amorphous hydrocarbon films, and that OH-C bonds are substituted with Si—C bonds through reduction.

Furthermore, comparing FIG. 6A to FIG. 6B, the strength of an amorphous hydrocarbon film, which is formed or aftertreated at 400° C., was greater than that of an amorphous hydrocarbon film, which is formed or aftertreated at 350° C. In other words, the inventor proved that, in the range of appropriate temperatures from about 300° C. to about 400° C., higher temperature may accelerate Si—C bonding, and thus surfaces of an amorphous hydrocarbon film may be more securely protected.

Figure 7B:
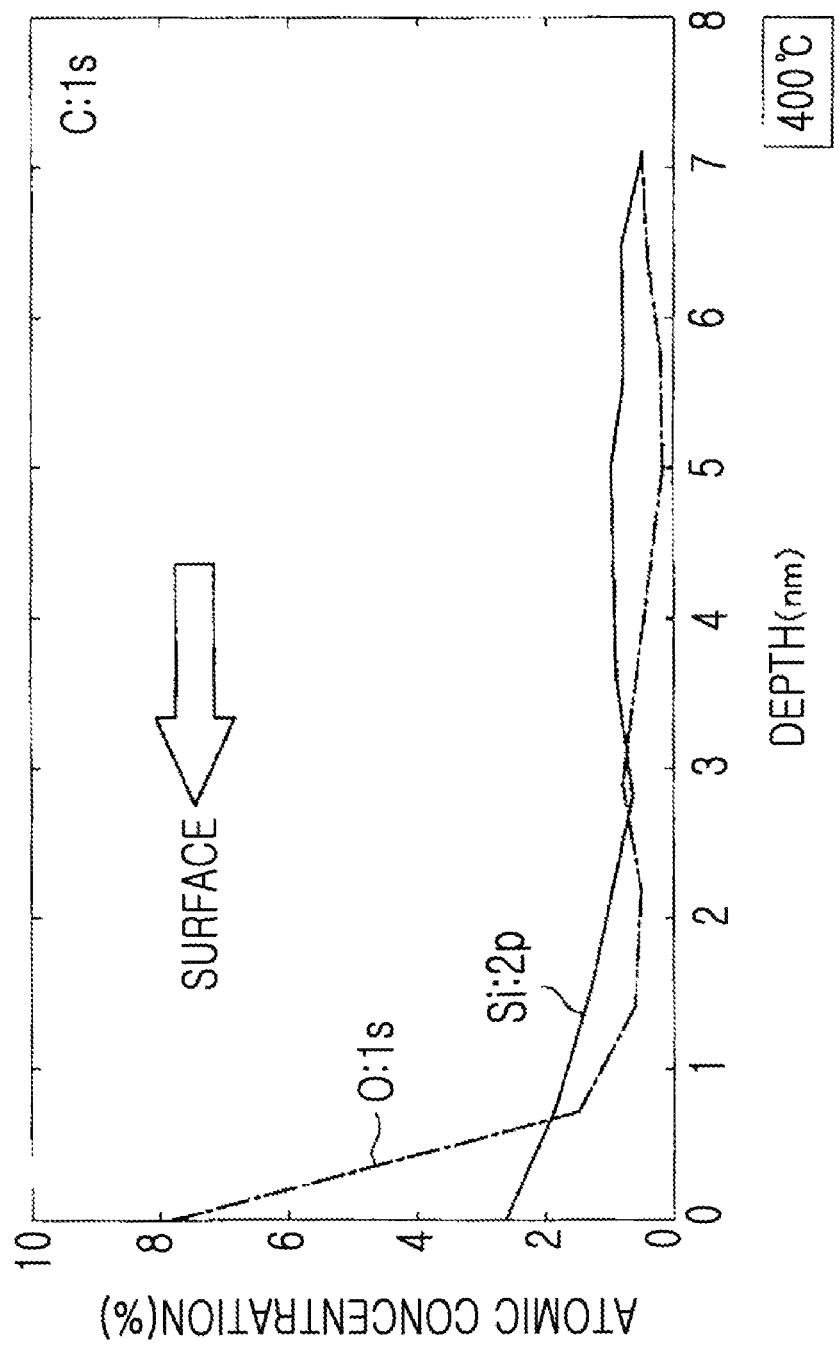
FIG. 7B is a diagram showing concentrations of each of atoms in a surface layer of an amorphous hydrocarbon film acquired by performing aftertreatment on the amorphous hydrocarbon film formed by changing temperature condition.

Furthermore, the inventor measured silicon concentrations to monitor states of surface layers of the amorphous hydrocarbon films in another way. An ESCA (Electron Spectroscopy for Chemical Analysis) is used for the measurement. Results under the above temperature conditions (1) and (2)

are respectively shown in FIG. 7A and FIG. 7B. Each of the graphs indicates a state of an amorphous hydrocarbon film closer to the surface of the amorphous hydrocarbon film more to the left of the graph.

As a result, it proved that, although oxygen atoms are absorbed to the outermost surface layer of an amorphous hydrocarbon film (O:1s orbit), values of the curved lines (Si:2p orbit) indicating silicon concentrations are also high, and thus Si—C bonds are sufficiently formed.

Furthermore, silicon concentration was high in a surface layer of the amorphous hydrocarbon film at a depth of about 1 nm when the temperature was relatively high, that is, 400° C. as shown in FIG. 7B. Therefore, the inventor proved that, also by silicon concentration of the surface layer of the amorphous hydrocarbon film, hydroxyl (OH) groups existing on surface of the amorphous hydrocarbon film are substituted with silicon atoms due to the heat treatment in the above silane gas atmosphere. Especially, the inventor proved that, in the range of appropriate temperatures from about 300° C. to about 400° C., higher temperature may accelerate dissociation of silane gas and chemical reactions, and thus substitution with Si—C bonds is further accelerated.

As described above, according to the method of aftertreatment of an amorphous hydrocarbon film according to the present embodiment, deteriorations of an amorphous hydrocarbon film due to absorptions of moisture or the like in later operations may be prevented by substituting polar hydroxyl groups (functional groups) with stable Si—C covalent bonds, and thus favorable characteristics of a manufactured electronic device may be maintained.

(Second Embodiment)

Next, a process for manufacturing an electronic device including a method of aftertreatment of an amorphous hydrocarbon film according to a second embodiment of the present invention will be described below with reference to FIG. 8, which is a cross-sectional view of each of operations and a sequence of the operations.

In the present embodiment, heat treatments performed in two stages in the first embodiment are combined as a single heat treatment as shown in the operation c of FIG. 8. In the operation c of FIG. 8, the desired time point for supplying silane gas may be either simultaneously as the heat treatment begins or during the heat treatment. If silane gas is supplied simultaneously as the heat treatment begins, surfaces of an amorphous hydrocarbon film may be protected with Si—C bonds by directly combining dangling bonds and silicon atoms without oxidizing the surfaces of the amorphous hydrocarbon film with hydroxyl groups or the like, as shown in the operations a through c of FIG. 9. Therefore, oxidization of surfaces of an amorphous hydrocarbon film may be prevented more effectively.

As described above, according to embodiments of the present invention, oxidization of surfaces of an amorphous hydrocarbon film may be prevented by protecting the surfaces of the amorphous hydrocarbon film by forming Si—C bonds on the surfaces of the amorphous hydrocarbon film.

Furthermore, although monosilane gas ($SiH_4$) is used for heat treatment in a silane gas atmosphere in the above embodiment, the present invention is not limited thereto, and effects as described above may be acquired by using a $Si_xH_y$ based gas for heat treatment in a silane gas atmosphere. Especially, the $Si_xH_y$ based gas may preferably include any one of monomethylsilane ($CH_3SiH_3$), dimethylsilane (($CH_3$)$_2$SiH$_2$), or trimethylsilane (($CH_3$)$_3$SiH). It is easy to be dissociated trimethylsilane, dimethylsilane, and monomethylsilane in the order stated, and thus temperature of heat treatment may be lowered by using trimethylsilane or dimethylsilane. For example, the suitable temperature for monomethylsilane is from about 300° C. to about 400° C., whereas the suitable temperature for dimethylsilane or trimethylsilane is from about 200° C. to about 300° C.

Furthermore, heat treatment in a silane gas atmosphere may be preferably performed on an amorphous hydrocarbon film with a thickness less than or equal to 10 nm. If a thickness of an amorphous hydrocarbon film is above 10 nm, permittivity of the amorphous hydrocarbon film increases, and thus high rate of an electronic device cannot be made.

Furthermore, an effect as described above may be acquired by performing heat treatment in a silane gas atmosphere under a pressure from the atmospheric pressure to 1 Torr. Furthermore, heat treatment in a silane gas atmosphere may be performed for from 10 minutes to 30 minutes.

Furthermore, although gas flow ratio of silane gas and argon gas is 1:1 in the above embodiment, the present invention is not limited thereto, and concentration of silane gas with respect to an inert gas may be from 10% to 100%. Other than argon gas, nitrogen gas or the like may be used as the inert gas.

Furthermore, the above process may be applied to both of a single wafer type process and a batch process.

In the above embodiments, the operations are related to each other, and thus the processes may be substituted with a series of operations in consideration of the relationships between each of the operations. Furthermore, due to the substitution, the embodiment of methods of aftertreatment of an amorphous hydrocarbon film may become an embodiment of method for manufacturing an electronic device.

Furthermore, by substituting each of the operations with each of processes, an embodiment of method for manufacturing an electronic device may become an embodiment of a control program for controlling a method for manufacturing an electronic device. Furthermore, by storing a control program for controlling a method for manufacturing an electronic device in a computer readable storage medium, an embodiment of a control program for controlling a method for manufacturing an electronic device may become an embodiment of a computer readable storage medium having recorded thereon a control program.

Although very appropriate embodiments of the present invention have been described above referring to the accompanying drawings, the present invention is not limited thereto. It is obvious that one of ordinary skill in the art can consider changed embodiments or modified embodiments within categories described in appended claims. Furthermore, changed embodiments or modified embodiments should be considered that changed embodiments or modified embodiments belong to technical scope of the present invention.

For example, although an example of applying an amorphous hydrocarbon film as an interlayer insulation film is shown in the above embodiment, the amorphous hydrocarbon film may be used for other purposes, such as an anti-reflective film or the like. Here, it is important for an anti-reflective film to have a particular refractive index value. Meanwhile, as described above, when an amorphous hydrocarbon film is exposed to the air after a heat treatment in a non-silane gas atmosphere, the refractive index of the amorphous hydrocarbon film tends to increase as time passes. Therefore, such a change of refractive index of an amorphous hydrocarbon film with the lapse of time may be prevented by using a method of aftertreatment of an amorphous hydrocarbon film according to the present invention. As a result, stable characteristics as an anti-reflective film may be acquired.

Furthermore, although it is assumed that a heat treatment, such as annealing or the like, is performed on an amorphous hydrocarbon film and the amorphous hydrocarbon film is exposed to the air thereafter in the above embodiments, the present invention is not limited thereto, and an effect as described above may be acquired in case of exposing an amorphous hydrocarbon film to an atmosphere containing some hydrogen and oxygen.

Furthermore, although a semiconductor wafer is used as an object to be processed in the above embodiments, the present invention is not limited thereto, and the invention may be applied to other substrates, e.g. a glass substrate or the like for a FPD (Flat Panel Display), such as a LCD (Liquid Crystal Display).

The invention claimed is:

1. A method of aftertreatment of an amorphous hydrocarbon film, the method comprising:
   forming an amorphous hydrocarbon film on a substrate; and
   performing a heat treatment on the amorphous hydrocarbon film in a $Si_xH_y$ based gas atmosphere at a temperature from 200° C. to 400° C. while supplying the $Si_xH_y$ based gas at desired time points, wherein the $Si_xH_y$ based gas engages in a chemical reaction with carbon from the amorphous hydrocarbon film to form Si—C bonds on surfaces of the amorphous hydrocarbon film.

2. The method of claim 1, wherein the $Si_xH_y$ based gas comprises any one of monomethylsilane, dimethylsilane, or trimethylsilane.

3. The method of claim 1, wherein the heat treatment in the $Si_xH_y$ based gas atmosphere is performed immediately after a heat treatment is performed on the amorphous hydrocarbon film in a non-$Si_xH_y$ based gas atmosphere.

4. The method of claim 3, wherein the heat treatment in the non-$Si_xH_y$ based gas atmosphere is annealing.

5. The method of claim 1, wherein the heat treatment in the $Si_xH_y$ based gas atmosphere is performed under a pressure from the atmospheric pressure to 1 Torr.

6. The method of claim 1, wherein the heat treatment in the $Si_xH_y$ based gas atmosphere is performed for from 10 minutes to 30 minutes.

7. The method of claim 1, wherein the thickness of the amorphous hydrocarbon film is less than or equal to 10 nm.

8. A method for manufacturing an electronic device, the method comprising:
   forming an amorphous hydrocarbon film on a substrate; and
   performing a heat treatment on the amorphous hydrocarbon film in a $Si_xH_y$ based gas atmosphere at a temperature from 200° C. to 400° C. while supplying the $Si_xH_y$ based gas at desired time points, wherein the $Si_xH_y$ based gas engages in a chemical reaction with carbon from the amorphous hydrocarbon film to form Si—C bonds on surfaces of the amorphous hydrocarbon film.

9. The method of claim 8, comprising forming a predetermined film on the amorphous hydrocarbon film after the heat treatment in the $Si_xH_y$ based gas atmosphere.

10. The method of claim 8, wherein the amorphous hydrocarbon film is an interlayer insulation film.

* * * * *